United States Patent [19]
Georgopoulos et al.

[11] Patent Number: 5,378,030
[45] Date of Patent: Jan. 3, 1995

[54] KEYLESS LOCKING DEVICE AND METHOD

[75] Inventors: George Georgopoulos, Pine Brook; Richard C. Dreisbach, North Arlington, both of N.J.

[73] Assignee: E.J. Brooks Company, Newark, N.J.

[21] Appl. No.: 48,263

[22] Filed: Apr. 14, 1993

[51] Int. Cl.$^6$ ............................................. B65D 45/30
[52] U.S. Cl. ............................. 292/256.6; 292/307 R; 292/327
[58] Field of Search ............ 292/256.6, 307 R, 307 A, 292/307 B, 258, 327; 70/34, 158–173, 14; 411/41, 61

[56] References Cited

U.S. PATENT DOCUMENTS

| | | | |
|---|---|---|---|
| 4,254,647 | 3/1981 | Finck, Jr. | 70/164 X |
| 4,415,190 | 11/1983 | Finck, Jr. et al. | 292/256.6 |
| 4,702,093 | 10/1987 | Dewalch | 292/256.6 X |
| 4,804,303 | 2/1989 | Statkus | 411/41 |
| 4,874,276 | 10/1989 | Iguchi | 411/41 X |
| 4,978,266 | 12/1990 | Becker et al. | 411/61 |
| 5,121,953 | 6/1992 | Mahaney | 292/256.6 |
| 5,163,795 | 11/1992 | Benoit et al. | 411/41 X |

*Primary Examiner*—Philip C. Kannan
*Attorney, Agent, or Firm*—William Squire

[57] ABSTRACT

A progressively set of more costly and higher level keyless locking devices secure an electric utility meter. A first low level and low cost keyless device includes a female member with spaced resilient legs which compressively converge when inserted in a plate hole and then naturally diverge to a normal state. A male locking member is inserted between the legs to lock the legs in the plate hole. A seal secures this arrangement. In a further embodiment, a female locking body is attached to a first end of a clamp ring. A second apertured ring end is inserted through the first ring end into the body. A keyless thermoplastic locking device of a first level is inserted into the body for securing the ring ends. A seal secures this arrangement. Other embodiments are disclosed including an all metal locking body used with a thermoplastic keyless male member for providing a higher security level and higher cost.

27 Claims, 7 Drawing Sheets

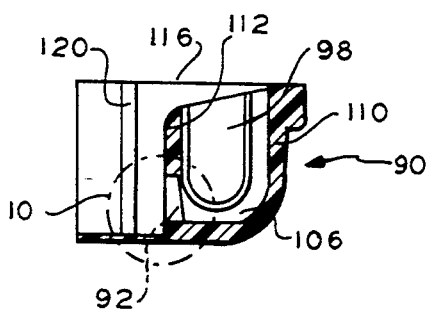
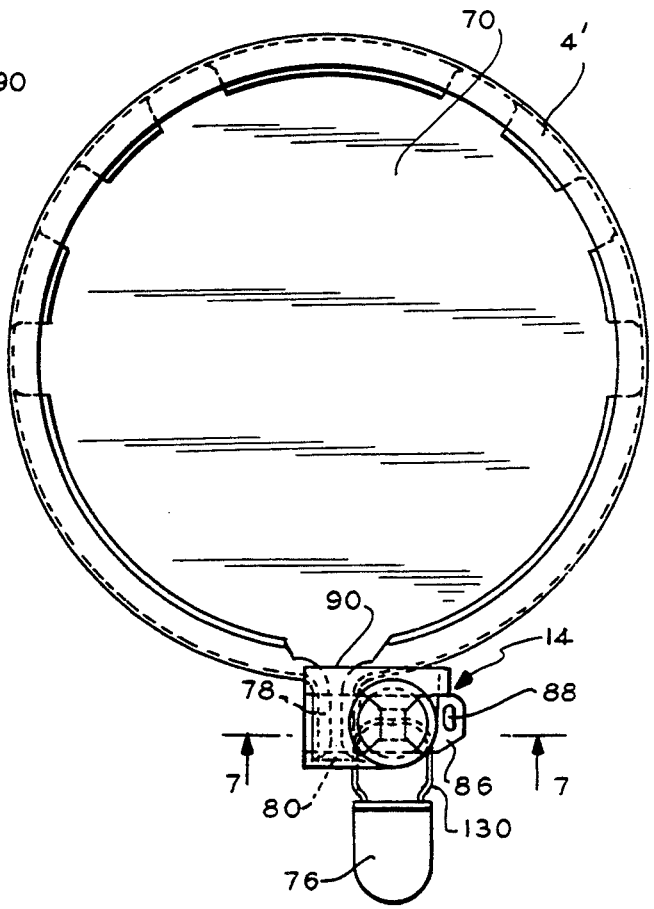
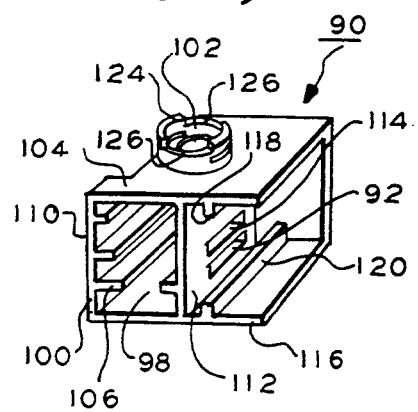
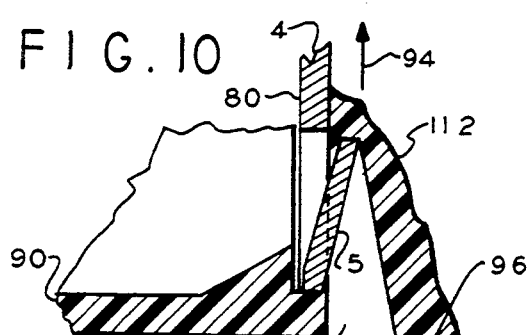
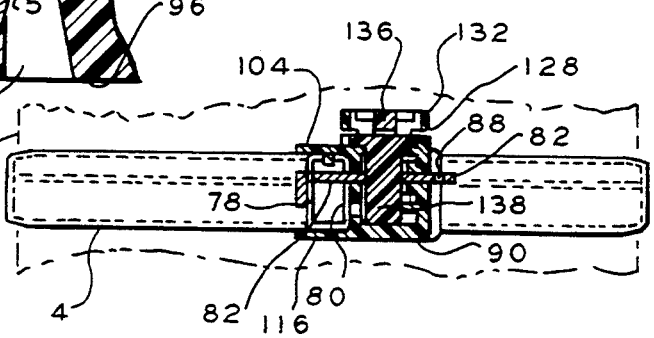

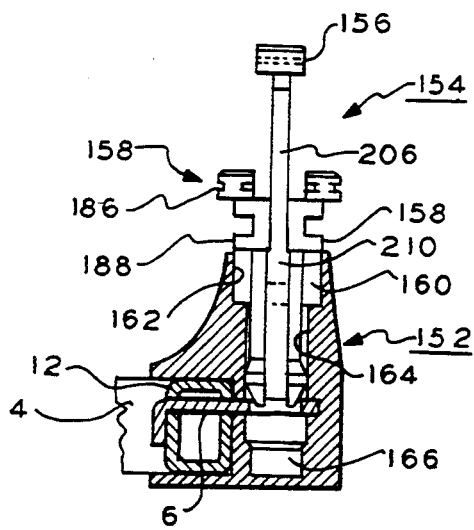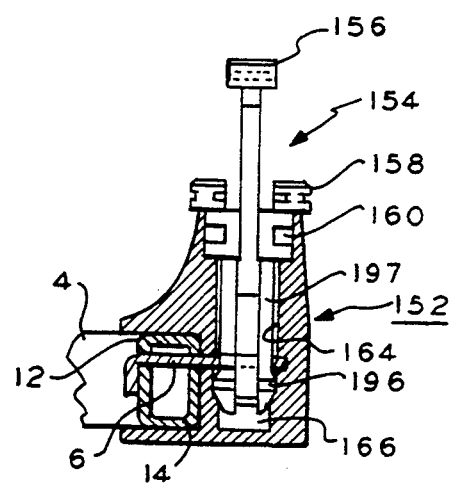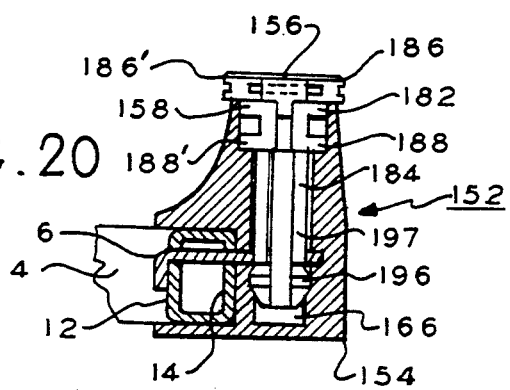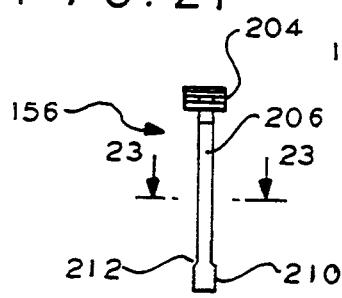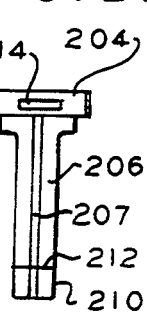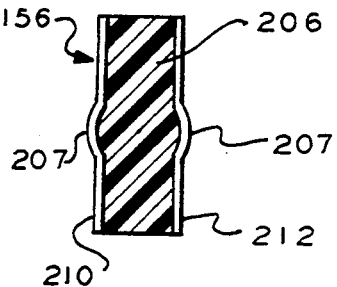

KEYLESS LOCKING DEVICE AND METHOD

FIELD OF INVENTION

This invention relates to the locking devices for securing clamping rings including means for securing the locking device with a padlock type seal, and more particularly, to electric meter clamping ring locking devices.

BACKGROUND OF THE INVENTION

Electric utility meters comprise a circular cylindrical base portion containing a high power socket and include an annular flange. An electric meter operating mechanism is enclosed in a circular cylindrical glass housing and includes mating socket blades for insertion into the socket of the base portion. The glass enclosed meter mechanism includes a circular flange which abuts the flange of the socket base portion, the flanges being clamped together with a circular clamping ring.

To preclude access to the meter and theft of electrical service, it is typical to provide locks and sealing mechanisms for sealing the clamping ring to indicate tampering and opening of the meter. The clamping ring comprises a circular channel shaped member having spaced ends which are resilient relative to one another in the plane of the ring. Flanges extend from these facing ends and are typically secured together by a variety of different locking mechanisms to secure the glass meter housing to the socket base.

In one embodiment a hole is provided in each of the mating flange portions at the extended ends of the ring and a locking device is inserted in the mating aligned holes to lock these elements together. Such a locking device is sometimes referred to as a barrel lock. A barrel lock may comprise a cylindrical element including a female member for receiving the cylindrical element. The cylindrical element has expansible balls which are expanded or retracted by a key mechanism. The barrel when inserted in the female member locks the two ring ends together. An additional aperture may be formed in the barrel lock for receiving a seal for further providing tamper evidence. This device requires what is referred to as a key. The key is a spring-loaded device inserted in the barrel lock for locking and unlocking the barrel lock. See for example, U.S. Pat. Nos. 4,446,603, 4,063,434, 4,008,535 and 4,049,313.

In a further embodiment of an apparatus for locking utility meters, the meter is enclosed in a steel box and the box is then in turn locked in place with a locking mechanism. This also uses a barrel lock and key. For example, U.S. Pat. No. 4,144,729 discloses an electric meter box lock. Of interest is co-pending application entitled Box lock Construction filed on Mar. 8, 1993, Ser. No. 08/027,385 now U.S. Pat. No. 5,315,849 and assigned to the assignee of the present invention and filed in the name of George Georgopoulos. This latter application also discloses an electric meter box lock device.

However, the electric meter box lock arrangement is relatively costly in that it requires a steel box with a hinged cover and a relatively costly lock mechanism for receiving a key-operated barrel lock of the type described above. This locking arrangement therefore is not desirable for use on every electric utility meter, because of the large number of such meters that are or may be installed. Further, it is recognized that a large number of utility customers are not prone to tamper with or steal electric service. Therefore, a relatively low cost locking device is recognized by the present inventors as most desirable for use with such widely available meters.

However, it is also recognized that in certain regions theft of service from the electrical meters is more likely to occur and more secure locking arrangements are required. However, it is not, as recognized by the present inventors, as desirable to provide a relatively high cost complex high security locking mechanisms on every meter even in these latter regions. That is because as is recognized not all customers in these regions are likely to steal electrical service although a higher percentage of such customers than in other regions may be prone to do so. Further, it is also recognized that when certain customers are confronted with the fact that they did in fact tamper with their electric meter service, that having been once caught as such an act, such customers will rarely attempt to steal service again. There is also recognized that some customers find it a challenge to open such security devices for electric utility meters and will repetitively attempt to break into such meters. With such repetitive action the present inventors recognize a need for a progressively increasingly more secure utility meter locking arrangement, which more secure arrangements are more costly as the level of security increase. Therefore, not only is the configuration of the locking devices changed from meter-to-meter in accordance with the frequency of occurrence of theft attempts from that meter, but as the locking security level increases, so does the cost.

SUMMARY OF THE INVENTION

A method of keyless securing a clamping ring to a plurality of annular elements according to the present invention relates to a clamping ring that has first and second ends normally in spaced relation, the ring being adapted wherein the ends resiliently displace toward each other, the ends including means such that one end has a hole that passes through the other end when the ends are engaged. The method comprises providing a plurality of keyless locking devices for mating and attachment to at least the one end so as to provide progressively higher level and more costly security for locking the ends together.

In accordance with an embodiment of the present invention, the providing step includes providing a first keyless locking device of a lower locking and cost level and formed only of thermoplastic material and the providing a second keyless locking device of a higher locking and cost level comprising a locking body for receiving a male member, the body being formed of thermoplastic. Then there is provided a seal for additionally locking the first locking device of such thermoplastic material. Then a keyless self-locking device is provided and lockable with a seal and then providing a locking device comprising a locking body formed of only metal whereby the ring is locked progressivley with keyless locks of different materials and more costly arrangement to provide progressively increased higher security to the locking arrangements.

In accordance with a further embodiment of the present invention, a locking device is provided for sealing a hole of a given transverse dimension in a member, the locking device is adapted to be locked in the hole having a given axial extent, the device comprising a head dimensioned greater than the hole transverse the axial direction to preclude the head from entering the hole. At least one leg depends from the head in an axial direction. The at least one leg has a distal portion and a proximal portion, the proximal portion being next adjacent to the head and smaller in dimension transverse the axial direction than the distal portion and at least as great in the axial direction as the axial extent of the hole. The at least one leg distal portion is resiliently secured to the head, the distal portion normally extending in the transverse direction a distance greater than the transverse extent of the hole and resiliently displacing transversely in response to insertion through the hole. A male lock member is adapted to be selectively secured to the head and depending leg for precluding the resilient transverse-displacement of the leg.

In a further embodiment, a pair of spaced legs depend from the head, the flange and legs being arranged so that the legs resiliently spread apart or converge in response to a corresponding spreading and converging force. The legs have a first portion adjacent to the head transversely dimensioned to be received in the hole in a first insertion direction and a second portion depending from the first portion having a transverse dimension greater than the hole transverse dimension such that convergence of the legs is required to insert the second portion through the hole in the first direction. The male locking member is dimensioned to be inserted in the female member between the spaced legs for precluding the convergence in a locking state.

IN THE DRAWING

FIG. 1a is a partial plan view of mating ends of an electric utility meter locking ring which may be used with the device of FIG. 1;

FIG. 1b is a fragmented partially in section plan view of a connecting link of the embodiment of FIG. 1 for resiliently connecting two halves;

FIG. 6 is a plan view of a second embodiment of a locking device according to the present invention employed with a electric utility meter clamping ring and sealed with a padlock type seal;

FIG. 7 is a sectional view of the device of the embodiment of FIG. 6 taken along lines 7—7;

FIG. 8 is a plan fragmented partially in section view of the female body portion of the locking device in the embodiment of FIG. 6;

FIG. 9 is an isometric view of the female body portion of FIG. 8;

FIG. 10 is a fragmented sectional plan view of a portion of the body of FIG. 9;

FIGS 18, 19 and 20 are sectional elevation views similar to the view of FIG. 16 illustrating the locking device thereof in various stages of locking;

FIGS. 21 and 22 are respective front and side elevation views of a male locking member used in the embodiments of FIGS. 18 through 20.

FIG. 23 is a section view taken onlong lines 23—23, FIG. 21;

DETAILED DESCRIPTION OF THE PREFERRED EMBODIMENTS

Figure 1:
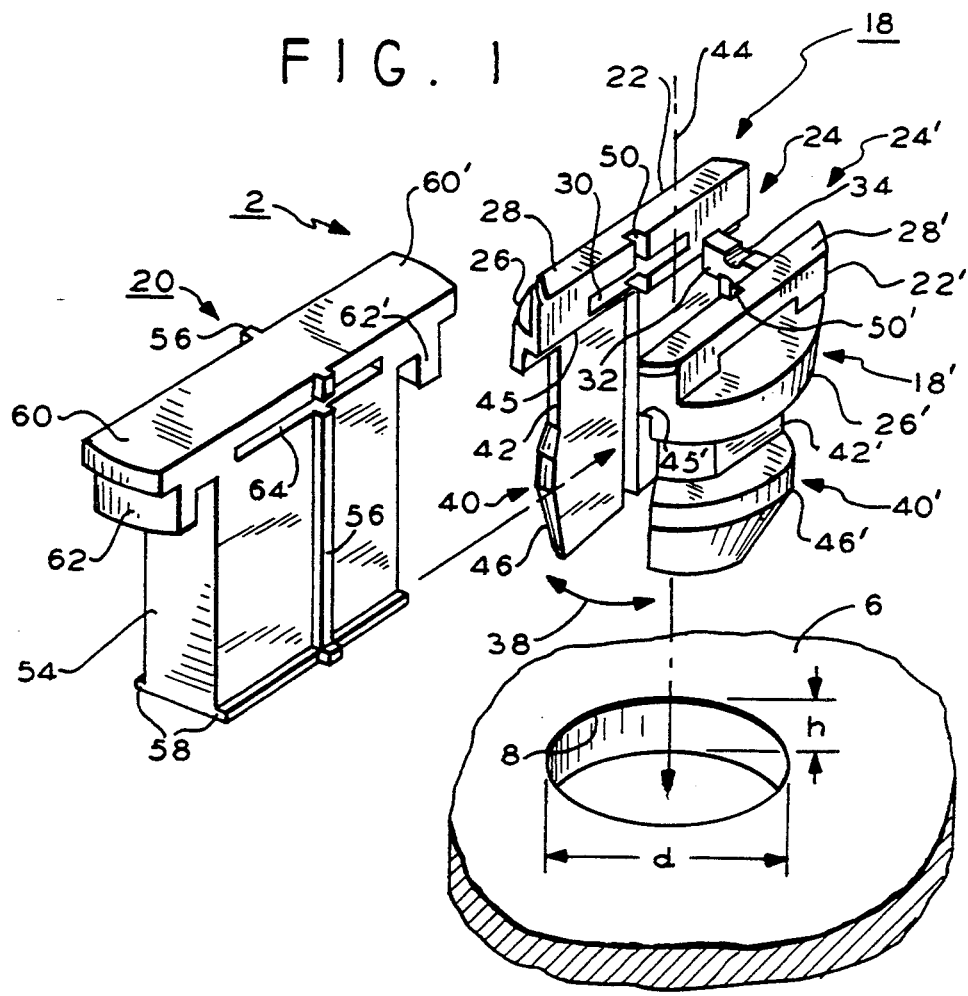
FIG. 1 is an isometric exploded view of a locking device in accordance with one embodiment of the present invention.
Figure 2:
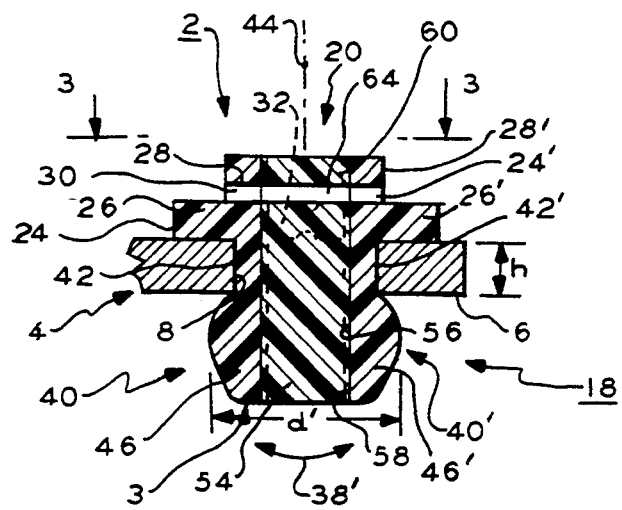
FIG. 2 is a sectional elevation view of the device of FIG. 1 in an assembled locking state.
Figure 3:
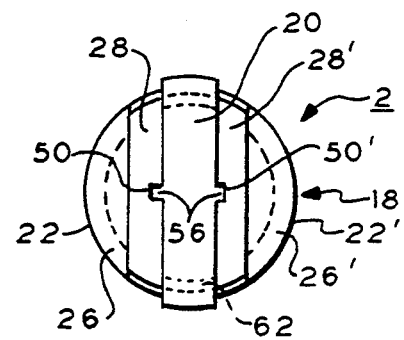
FIG. 3 is a plan view of the device of FIG. 2 taken along lines 3—3.

Throughout the following description elements with like reference numerals refer to identical parts. In FIGS. 1 and 2, locking device 2 in accordance with one embodiment of the present invention includes a female member 18 and a male member 20 secured to a ring 4 tab member 6 via hole 8 in the member 6. The ring 4 is similar to the ring 4' illustrated in FIG. 11 except that the tab member 6, FIG. 1a, is of shorter length than the comparable tab member in the ring of FIG. 11 which ring is employed with a different embodiment locking device. Also, the tab member 6 does not have a second end hole therein. Ring 4', FIG. 11, further includes a locking tab 5 for purposes to be explained in connection with the embodiment of FIG. 11. The tab 5 may or may not be included in the ring 4 of FIG. 1a and is not shown in FIG. 1a.

FIG. 1a, the ring 4 comprises a circular U-shaped channel 10 which terminates at the ring ends including radially outwardly extending end members 12 and 14. Members 12 and 14 are juxtaposed in the plane of the ring 4. Tab member 6 is secured to member 12, for example, staked, and comprises a planar sheet element. The member 14 has a slot 16 through which the tab member 6 passes when the members 12 and 14 are resiliently displaced in abutting relation as shown in FIG. 1a. Tab member 6 is inserted in slot 16 by forcing the members 12 and 14 together whose natural resilient tendency is to maintain a spaced apart relation, FIG. 11.

In FIGS. 1 and 5a–5c, the female member 18 comprises two identical halves 22 and 22' attached in mirror image fashion and a description of half 22 is representative. Half 22 comprises a head 24 including a flange portion 26 and an upstanding ridge 28 and a shank comprising a depending leg 40. A slot 30 is formed in ridge 28 central thereof and is flush with the top surface of flange portion 26. A connecting link 32 connects the head of half 22 to the head 24' of the opposing half 22'. The link 32, as best seen in FIG. 1b, has a U-shaped groove 34 in one surface 35 and an opposing groove 36 of like dimensions in the opposing surface 37. The link 32 with the grooves 34 and 36 forms a hinge member for resiliently connecting halves 22 and 22'. As a result, the halves 22 and 22' may rotate with respect to each other about link 32 in directions 38 relative to each other. This rotation in directions 38 is about a fulcrum established by the reduced region between grooves 34 and 36 in link 32.

The halves 22 and 22' have facing interior surfaces at the respective heads 24 and 24' which include a respective shoulder 45 and 45', FIG. 1. The portion of the halves 22 and 22' in the vertical direction of axis 44 co-extensive with flange 26 and ridge 28 has a smaller transverse spacing dimension as compared to the transverse dimension between the shank portions comprising legs 40 and 40' at corresponding facing interior surfaces. The shoulders 45 and 45' on each half 22 and 22' serve an important function as will be described.

Identical mirror image legs 40 and 40'; FIGS. 1 and 5a–5c, depend from respective ones of the flanges 26 and 26', FIGS. 1 and 2. Each of the legs has external surface sections 42 and 42', respectively, having an axial extent along axis 44 which is at least the same as the thickness h of the tab member 6 of the ring 4. Sections 42 and 42' closely receive the tab member 6 and have an axial extent no smaller than dimension h of the tab member 6. The axial extend of section 42 may be somewhat greater than that of the tab member 6 depending on how much axial play is desired for a given implementation. The sections 42 and 42' have a external surface which is partially a circular segment at the edges and flat therebetween and dimensioned to fit within hole 8 of the tab member 6. This shape is not critical.

The leg 40 depends from section 42 an axial extent away from flange portion 26 section 46. Section 46 tapers outwardly from axis 44 an extent greater than the diameter of the hole 8. The section 46 tapers in the axial direction toward axis 44 distal and proximal section 42. At its largest thickness, section 46 has a circular segment external surface in the preferred embodiment but need not be circular in accordance with a given implementation. The tapered portions of section 46 are portions of a cone, have a radial extent from axis 44 greater than the radius of the hole 8 so as to provide an interference fit with the hole 8 as shown in FIG. 2.

In FIG. 1, each of the legs 40 and 40' have opposing axially extending grooves 50 and 50', respectively. The grooves 50 and 50' are rectangular or square in cross section and preferably square in this embodiment.

The legs 40 and 40' are resiliently secured relative to one another via the link 32 so that the sections 46 and 46' may be squeezed together selectively in directions 38 to permit the legs to be inserted through hole 8 in tab member 6. When the body 18 is inserted into the tab member 6 it is inserted in the axial direction along axis 44 into hole 8 so that the legs 40 and 40' pass through the hole 8 and protrude through the other side as illustrated in Figures. However, as is apparent, because the legs 40 and 40' are resiliently secured to one another in the transverse direction for permitting the body 18 be inserted and retracted from the hole 8 of the ring tab member 6, further structure is required in order to lock the body 18 to the tab member 6. The body 18 in FIG. 4, for example, is not locked to the member 6.

For this reason male locking member 20 is provided to lock the legs 40 and 40' in the position shown in FIG. 2 providing a locking state for the device 2. The member 20 is T-shaped having an elongated body 54 rectangular in cross section with two longitudinally extending ribs 56 which are adapted to be received in respective grooves 50 and 50' of corresponding halves 22 and 22'.

The body 54 of member 20 has a lower most rib 58 on each side thereof extending transversely a rib 56 on that side. The upper portion of body 54 forming the T of member 20 includes transversely extending identical extension sections 60 and 60' at opposite ends. Section 60 is representative and includes a depending leg 62. The external surface of legs 62 and 64' on each side of the T of member 20 is a section of a circle to form a continuous circular surface with the radial external surface of flange portions 26 and 26'. A portion of sections 60 and 60' extend beyond legs 62 to form a gripping structure. The extended ends are used for manual removal of the locking member 20 from between the flanges and legs of the female member 18 when in the locking state, FIG. 2. This places the device in the unlocked state of FIG. 4. A slot 64 in the upper portion of the member 20 aligns with the slot 30 of the female member 18 in the locking state, FIG. 2.

In operation, the locking member 20 is inserted from the side of female member 18 with the ribs 58 beneath the shoulders 45 and 45' toward the bottom of the figure in the respective halves 22 and 22'. The ribs 58 and shoulders 45 lock the locking member 20 in the vertical direction along axis 44 toward the top of the figure so that is cannot be disengaged from the member 18 in this direction. The vertical ribs 56 of the locking member 20 engage the grooves 50 and 50' on each of the respective halves 22 and 22'. However, the grooves are engaged only in that portion of the body 3 co-extensive with the upstanding ridges 28, 28' and flange portions 26 and 26'.

The reason for this is that the corresponding rib 56 co-extensive with the rib 58 of the locking member 20 at the bottom of body 54 engages the grooves 50 and 50' spacing the remainder of the ribs 56 out of the grooves 50 and 50'. Because the spacing between the flange portions 26, 26' and the ridges 28, 28' at the top of the member 18 is closer than that of the legs 40 and 40', the ribs 56 of the locking member 20 engage that portion of the grooves 50, 50'. Therefore, at all times the ribs 56 at the base and at the top of the member 20 are engaged in a corresponding portion of the grooves 50, 50'. This permits the locking member 20 to be slid in the axial direction axis 44 toward the top and bottom of the drawing while remaining engaged with the respective ribs and grooves.

Figure 4:
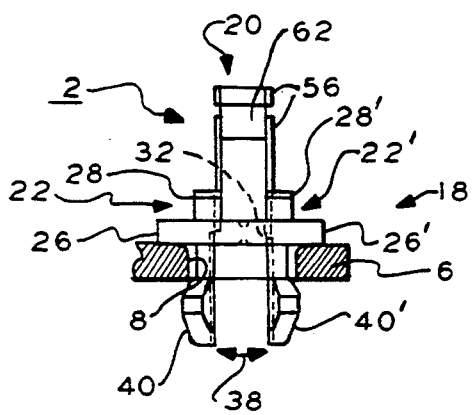
FIG. 4 is a sectional elevation view of the device of FIG. 1 in which the device is assembled to the ring of FIG. 1a, but is in an idle unlocked state and is temporarily secured to the ring.
Figure 5A:
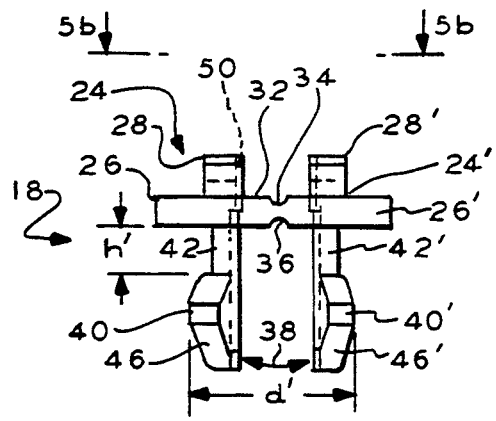
FIG. 5a is a front elevation view of the female portion of the device illustrated in FIG. 1.
Figures 5B, 5C:
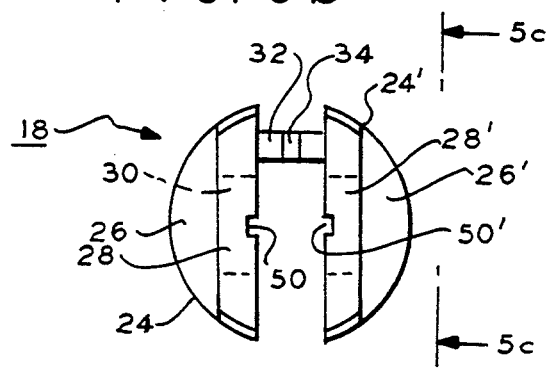
FIG. 5b is a plan view of the device of FIG. 5a taken along lines 5b–5b.
FIG. 5c is a side elevation view of the device of FIG. 5b taken along lines 5c–5c.

The ribs 58 at the bottom of body 54 serve as a stop to preclude the member 20 from disengaging from member 18 in the vertical upward direction. At the uppermost position of the locking member 2, the locking member remains locked to the member 18 but the legs 40 and 40' of the body 3 may resiliently converge in directions 38 when forced to do so, FIG. 4. In the configuration of FIG. 4, legs 40 and 40' can thus be inserted into the hole 8 of tab member 6 while the locking member 20 remains secured to the member 18. This insertion locks member 20 to member 18.

To lock the device 2, the locking member 20 is displaced in the axial direction between the legs 40 and 40' until it is fully seated as shown in FIG. 2. In the fully seated position, the locking member 20 is between the legs 40 and 40'. When so inserted the legs 40 and 40' cannot be resiliently converged toward one another. A seal shackle preferably of the padlock type is then passed through the aligned slots 30 and 64 of the members 18 and 20 to further lock the members in the locking state of FIG. 2.

In the embodiment illustrated, a pair of legs 40 and 40' are employed. It will be apparent that the device 2 may operate with a single leg in a similar manner because the locking member 20 is relatively rigid. When fully inserted juxtaposed with one of the legs 40 and 40', it prevents that leg from converging resiliently in a direction precluding member 18 from being removed from the hole 8, FIG. 2. Therefore, the female member 18 need only have a flange portion such as portions 26 and 26' on each of the halves 22 and 22' and only one of the legs 40 and 40' need to depend from one of these halves to perform the locking action. Further, while a circular locking device has been illustrated, it will be apparent to those of ordinary skill in the art that other geometrical shapes can be provided the locking device 2 to perform the locking function as described.

The device 2 serves an important function of sealing a hole in a plate or other similar member preventing access to the hole, for example, the hole employing a barrel lock described in the introductory portion. Of course, the locking device could serve to lock two plate members together in which the axial extent of sections 42 and 42' of member 18 is sufficient to abut and receive each hole of a pair of vertically aligned tab members 6. If more than two tab members are desired to be locked together, the axial extent of the device may be lengthened accordingly. The important aspect is that at least one of the legs 40 and 40' have an outer transverse dimension from the axis 44 sufficient to preclude extraction of the device 2 from a mating hole with the male locking member 20 in place. While the male locking member 20 is illustrated in this embodiment as rectangular, it will be apparent that other shapes may be used as well.

In FIG. 6, a second embodiment of the present invention is illustrated employing an electric meter 70 which is clamped in place by a clamping ring 4' having a locking device 74 which is sealed by a padlock type security seal 76. The ring 4', FIGS. 6 and 11, has two ends 78 and 80. A metal tab 82 (FIG. 11) is staked to end 78. The tab 82 lies in the plane of the ring 4'. A circular hole 84 is formed in the tab 82. The end 86 of the tab 82 may have a slot 88 for receiving a seal such as the padlock seal 76 of FIG. 6. A slot (not shown) is formed in ring end member 80 through which the tab 82 may pass as shown in phantom in FIG. 11 and in solid in FIG. 6. A locking tab 5 is formed in the end member 80. A body 90 is then locked to the tab 5 of the ring 4'FIG. 11, cannot easily be removed from the ring 4' and forms a permanent assembly with the ring 4.

In FIG. 10, the body 90 includes a recess 92. The recess 92 is dimensioned to receive the locking tab 5. The body 90 is slid in direction 94 over ring 4' the end 80 until the tab 5 snaps in place in recess 92. The recess 92 is open to the ambient at wall 96. [Why] In FIGS. 9 and 14, the body 90 includes a cavity 98 open at end 100. Cavity 98 is otherwise enclosed except for an opening 102 in the uppermost wall 104 for receiving a locking device as will be described. A plurality of ribs 106 are formed in the cavity 98 for the purpose of providing a smooth molded exterior all 110 surface. Cavity 98 is formed by an interior wall 112. The wall 112 has a slot 114. A wall 116 forms the bottom of cavity 98 to which is integral the interior wall 112. A rib 118 depends from upper wall 104 outside of cavity 98 and a rib 120 upstands from bottom wall 116 aligned with rib 118. The ribs 118 and 120 extend for the width of the upper and bottom respective walls 104 and 116. The space between the ribs 118 and 120 and wall 112 forms a channel for receiving end 80 of the ring 4'. Recess 92 for receiving ring tab 5 is formed in wall 112. A slot 122 is formed in external wall 110 aligned with slot 114 for receiving tab 82 of the ring 4'.

Figure 14:
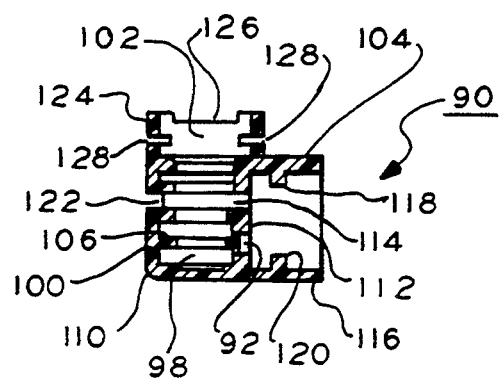
FIG. 14 is a sectional side elevation view of the female body of FIG. 9.

Upstanding from top wall 104, FIGS. 9 and 14, is a hollow circular cylinder 124. The body 90 is preferably formed of molded thermoplastic such that all of the structures of FIG. 9 and FIG. 14 are formed as an integral unitary structure. The cylinder 124 has opposing recesses 126 on opposite sides of its upper extending edge. The cylinder 124 also has opposing slots 128. The slots 128 are dimensioned to receive a shackle 130 of padlock seal 76.

Figure 11:
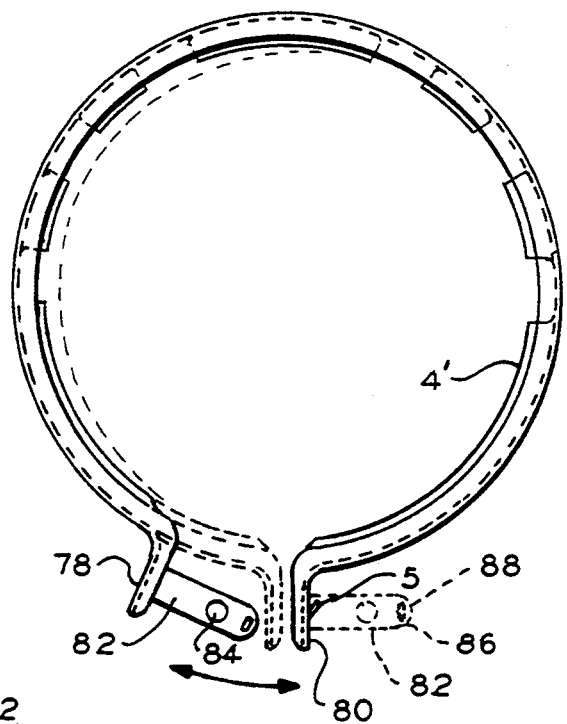
FIG. 11 is a plan view showing a clamping ring for use with an electrical utility meter in accordance with one embodiment.
Figure 12:
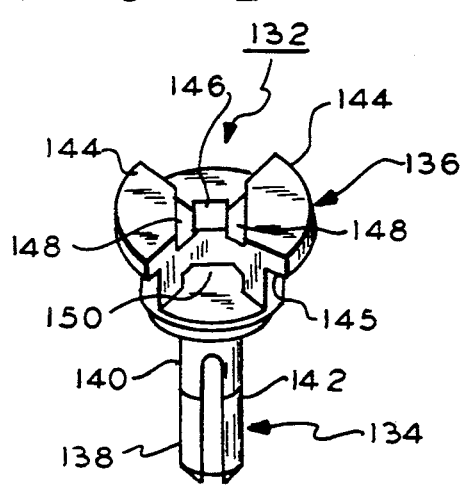
FIG. 12 is an isometric view of a male locking member of the embodiment of FIGS. 6 and 7.
Figure 13:
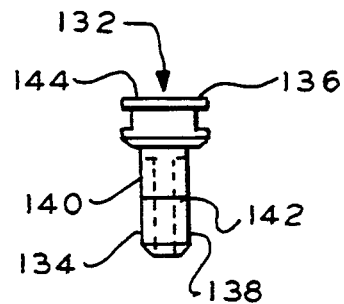
FIG. 13 is a side elevation view of the member of FIG. 12.

In FIGS. 12 and 13, a male member 132 is dimensioned to be received in the opening 102 of the body 90 (FIG. 14) and in hole 84 of the tab member of the ring 4' (FIG. 11). The male member 132 includes a shank 134 and a head 136. The shank 134 has a larger diameter in the lower section 138 than in the upper section 140 immediately proximal to and depending from the head 136. The diameter of section 138, however, is sufficiently small to pass through the hole 84 in the tab 82 of the ring 4. A step 142 spaced from the head 136 has an axial length sufficient to permit the tab 82 to be substantially co-extensive with section 140 between step 142 and head 136. The head 136 includes a pair of oppositely disposed triangular like radially outwardly extending sections 144. The sections 144 are dimensioned to be closely received in recesses 126 at the upper edge of cylinder 124, FIG. 9. The head 136 is also dimensioned so that the upper surface thereof is flush with the top edge of cylinder 124 when member 132 is fully inserted in body 90. The sections 144 extend beyond the lower portions of the head 136 to form shoulders 145 which rest on the cylinder 124 at the base of the corresponding recesses 126 to form a smooth external circular cylindrical surface with cylinder 124. The sections 144 are spaced from a center boss 146 by a pair of parallel grooves 148. A slot 150 is formed in head 136 beneath boss 146 and grooves 148 and extends through the head 136. Slot 150 is aligned with slots 128 of the body 90 when member 132 is fully inserted therein.

In operation, the ring 4' with the body 90 attached normal is spaced from end 78, FIG. 11. The clamping ring 4' is then attached to an electric utility meter 70, FIG. 6, for locking the different portions of the meter 70 together via circular external flanges in a known way. The flanges of the meter 70 fit within the channel formed by ring 4'. The ring end 78 is then closed toward end 80 with the tab 82 inserted through the end 80 as shown in phantom in FIG. 11 and in solid line as shown in FIG. 7. The tab 82 and the hole 84 therein are so dimensioned that the tab 82 extends through the body 90, FIG. 7. The tab 82 hole 84 is then aligned in this position with the opening 102 of the body 90, FIG. 9, which hole is aligned with cavity 98 of the body 90.

With the ends of the ring 4' held in the position of FIG. 7, the male member 132 shank 138 is fully inserted into the opening 102 and passed through the hole 84 of the tab member 82 of ring 4. The ring 4' because its ends have been resiliently displaced relative to each other to the position to the right of FIG. 7, through internal spring forces, tends to naturally return to the left in the unlocked state of FIG. 11 as shown in solid line. This forces the tab 82 in the region about hole 84 to displace to the left in FIG. 7, causing the tab 82 to abut firmly the shank 138 in section 140 above step 142, quasi-locking the shank 138 in place. An attempt to displace the male member 132 vertically to remove it from the opening 102 and hole 84 of the tab 82 is resisted by step 142. This serves as a temporary lock so that the elements remain locked together for purposes of shipping the assembly to a customer. The customer can easily remove the locking member 132 by squeezing the ends of the ring together and freeing the shank 138 so it can be vertically extracted from the body 90.

The clamping ring 4' then may be clamped about the utility meter 70 of FIG. 6 and reassembled as shown in FIG. 7. Once the male locking member 132 is in place in the locking state the padlock seal 76, FIG. 6, is then locked to the assembly by threading its shank 130 through slots 128 in the cylinder 124 and slot 150 in the male member 132. The shank 130 is then locked to the body of the padlock 76 securing the assembly in place. This assembly is somewhat more costly than the locking device of FIG. 1, but is less costly than other embodiments as will be described in connection with FIGS. 14–26.

Figure 15:
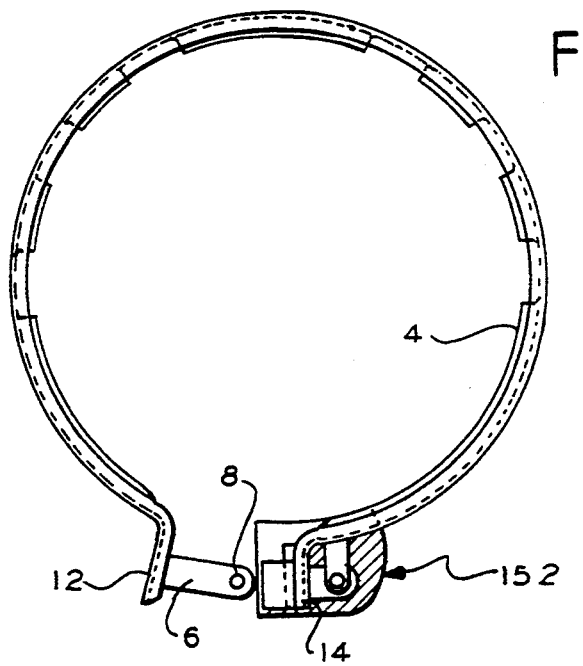
FIG. 15 is a plan view similar to the view of FIG. 11 illustrating a second locking female body which is all metal in accordance with an embodiment of the present invention.

In FIG. 15, a locking body 152 is secured to ring 4 end 14 similar to the attachment of body 90, FIG. 7. Locking device 154, FIGS. 18–20, is secured to the body 152 to lock the tab member 6 to end 14 of ring 4. The locking device 154 is similar in function and operation as the locking device 2, FIG. 1. In FIGS. 18–20, the locking device 154 comprises a male locking member 156 and a female locking member 158. The male member 156 will be described in connection with FIGS. 21 through 23 and the female member in connection with FIGS. 24 through 26. The male member 154 corresponds generally to the male member 20 of the device 2 and the female member 158 corresponds generally to the female member 18 of the embodiment of FIG. 1.

Figure 16:
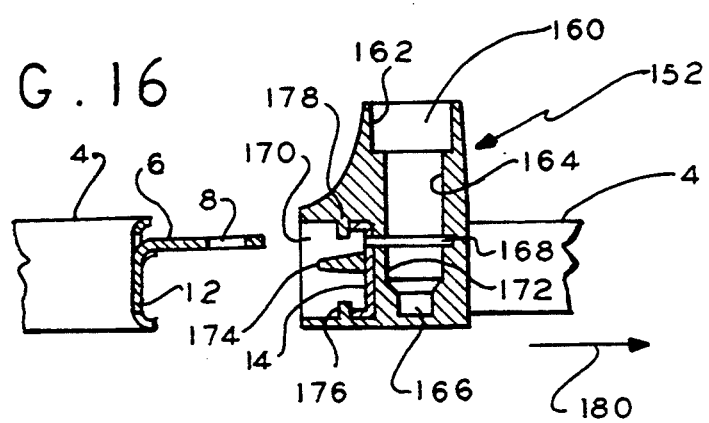
FIG. 16 is a sectional elevation view of the embodiment of FIG. 15 taken through the locking device.
Figure 17:
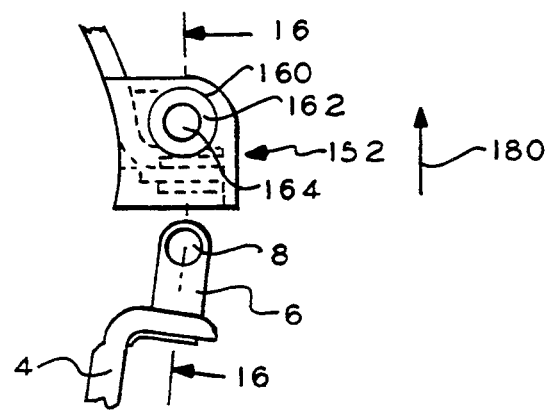
FIG. 17 is a plan view of the embodiment of FIG. 15 illustrating the female locking body and mating ends of an electric utility meter clamp.

In FIGS. 15 through 17, the body 152 comprises all metal and is preferably die cast. A stepped conduit 160 is formed with an enlarged recess 162 at its egress and a relatively elongated narrower conduit 164 which terminates in a relatively narrower recess 166 at the lower end of the conduit 160. A transverse slot 168 is formed in the wall of conduit 164 for receiving the tab member 6. A cavity 170 is separated from conduit 160 by wall 172, the slot 168 being formed through wall 172. A transverse rib 174 is spaced from wall 172 for slidably receiving end 14 of ring 4 therebetween. Upstanding and depending respective ribs 176 and 178 are formed in the bottom and upper walls of cavity 170 for closely slideably receiving and locking the ring 4 end 14 to wall 172. Rib 174 is wedge shaped for guiding the tab member 6 into the slot 168 in direction 180.

Figure 24:
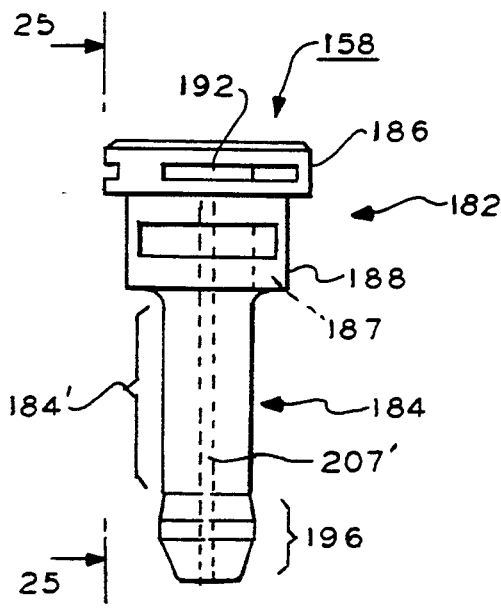
FIGS 24, 25 and 26 are respective front, side and plan view of a female looking member used in the embodiment of FIGS. 18–20.
Figure 25:
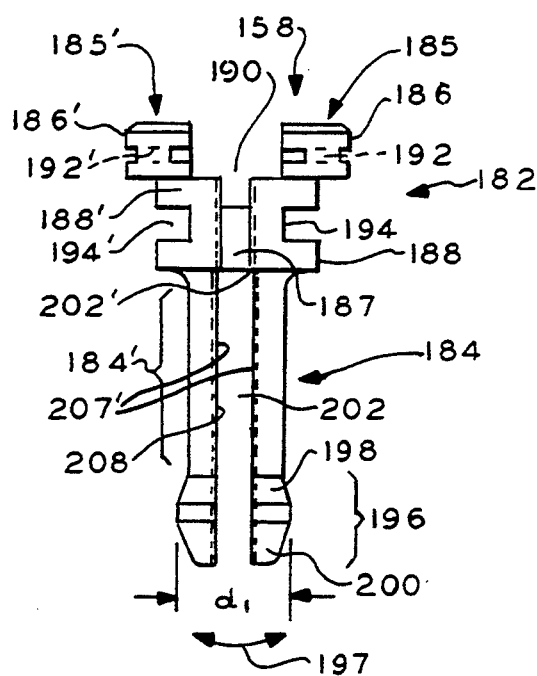
Figure 26:
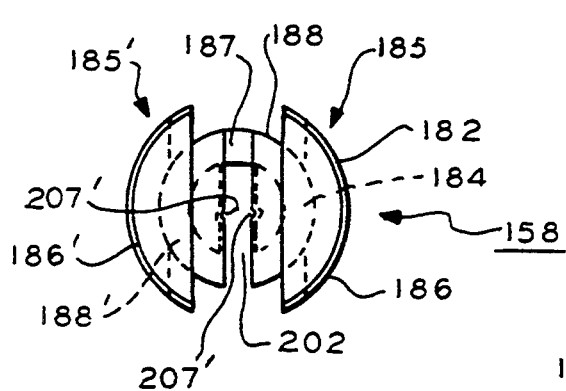

In FIGS. 24 through 26, the female member 158 of the locking device 154 comprises two mirror image identical halves 185 and 185'. The description of half 185 is representative. The two halves 185 and 185' are connected by a connecting link 187. Half 185 includes a head 182 and a shank 184 depending from the head 182. The head 182 includes an upper flange 186 and a lower flange 188. The corresponding parts of the half 185' have the same reference numerals with a prime. The two upper flanges 186 and 186' are separated by a rectangular recess 190.

The connecting link 187 is rectangular in cross section and does not have reduced cross section. The connecting link 187 connects the lower flanges 188 and 188' at one end thereof as best seen in FIGS. 24 and 26. A slot 192 is formed in each of the upper flanges 186 and are aligned. The upper flanges 186 and 186' and the lower flanges 188 and 188' are segments of circles as best seen in FIG. 26. The exterior peripheral edges of the flanges 188 and 188' are such so as to be closely received in recess 162 of conduit 160, FIG. 16, in the locking state of the device 154, FIG. 20. The lower flanges 188 and 188' each have a corresponding recess 194 and 194' respectively to save material. The shank 184 of each half 185 and 185' together form segments of a circular cylinder that is elongated. The diameter of the circular cylinder formed by shank 184 of each half in an upper portion 184' is of reduced diameter as compared to the lower portion 196. The lower portion 196 forms segments of circular and conical figures of revolution similar to the female member 18, FIG. 1.

The overall diameter $d_1$ of the portion 196 is greater than the diameter of hole 8 of the tab member 6 of ring 4, FIG. 16. The diameter of the shank 184 portion 184' has a diameter which is closely received within hole 8 of the ring 4 tab member 6. The upper and lower surface portions of portion 196 are conical to permit easy insertion and retraction of the portion 196 through the hole 8, similar to the function of the conical portions of legs 40 and 40' of the device 2 female member 18, FIG. 1.

Shank portion 184' is of sufficient length such that the lower portion 196 is relatively resilient with respect to the link 187 and the two halves of portion 196 can displace toward one or another resiliently in directions 197 when forced to do so during insertion into the smaller hole 8 of the tab member 6. The space between the two halves 185 and 185' of the female member 158 forms a slot 202. Grooves 207' extend axially on the mating interior facing surfaces 208 of each of the female member 158 halves 185 and 185' from flange 186 along shank 184 to the lowermost end of shank 184, FIGS. 24–26. The slot 202 of the female member 158, FIGS. 24–26, has a reduced transverse dimension coextensive with link 187 forming a shoulder 202'. The shoulder 202' is on each of the halves 185 and 185' between the shank 184 and flanges 188 and 188'.

The male member 156, FIGS. 21 through 23, is dimensioned to be closely received in the slot 202. The male member 156 comprises a head 204 and a shank 206. A pair of ribs 207 formed as elongated sections of a circular cylinder are on opposing sides of the shank 206. The ribs 207 fit within mating member 158 grooves 207'. The lower portion 210 of shank 206 is enlarged. Enlarged portion 210 is separated from the remainder of the shank 206 by a shoulder 212. Shoulder 202' of member 158 serves as a stop and engages the shoulder 212 of the male member 156. This prevents the male member 156 from being fully retracted from the slot 202 in a direction from the bottom to the top of the drawing FIGS. 24–26. In this way the male member 156 needs to be inserted into the slot 202 by sliding transversely into the slot 202 in and out of the drawing, FIGS. 18–20.

The head 204 of the male member 156 has a slot 214 which is aligned with slots 192 and 192', FIG. 25, when the male member is fully inserted into the female member as shown, FIG. 20. The ribs 207 and grooves 207' of the respective male and female members provide an engaged relationship such that the male member slides up and down in a vertical direction from the top to the bottom of the drawing. Once the male member 156 is inserted in the slot 202, the female member 158 can then be placed in an idle state, FIG. 18. In this condition, the male member 156 cannot be withdrawn toward the top of the drawing figure because of the engaged relationship of shoulder 212 of the male member and the shoulder 202' of the female member.

In FIG. 19, the female member is fully depressed within the conduit 160 of the locking device body 152. This inserts the lower enlarged portion 196 through the hole 8 of the tab member 6 of the ring 4'. However, the locking device 154 is not locked. The male member 156 is then pushed downward and fully inserted into the female member as shown in FIG. 20. This locks the two halves of the shank 184 and 184' in spaced apart relation so that the enlarged lower portions 196 of the shank 184 cannot be compressed toward one another directions 197. This locks the locking device 154 to the tab member 6. A padlock such as illustrated in FIG. 6 is then secured via slots 190, 192' and 214 of the female and male members. A major portion of the locking device 154 is buried within the metal body 152 and is not readily accessible.

It should thus be appreciated that different levels of security are provided by the different devices. The lowest cost and also the least security is provided by the device of FIG. 1 without a locking body such as body 90, FIG. 6. This is the lowest cost because it comprises two elements which are preferably molded thermoplastic and provides the least security because the locking device is entirely exposed to the ambient and, therefore, is subject to significant tampering. For example, the legs 40 and 40' may be snapped off and then glued in place later because of their exposure. Thus, evidence of tampering is not readily apparent. However, should such tampering become evident, the next level of security is provided by the device of FIG. 6. Here the locking device is buried within the plastic body secured to the ring 4. The locking device therefore is less accessible and tampering becomes more evident. In this case, the locking seal 76 needs to be broken in order to open the device. Further, a second padlock seal 76 (not shown) can be attached via the optional slot 88 in the tab member of the locking ring 4. Also, the male member is flush within the body 90 and thus is less accessible and more difficult to remove. However, the body 90 of FIG. 6 is also molded thermoplastic and may be subject to tampering, breakage and glued together subsequently.

To provide greater security, the all metal body of the embodiment of FIGS. 15 through 20 is provided. This is more costly because the metal body 152 is more costly to fabricate than a molded thermoplastic body. However, it is more secure in that the body 152 is less susceptible to tampering. In this case, the tamperer must remove the locking seal and the locking device in order to open the ring 4'. Such tampering thus becomes more evident. If such tampering does become evident, then a more secure arrangement of FIG. 27 is provided which is more costly because it is all metal.

Figure 27:
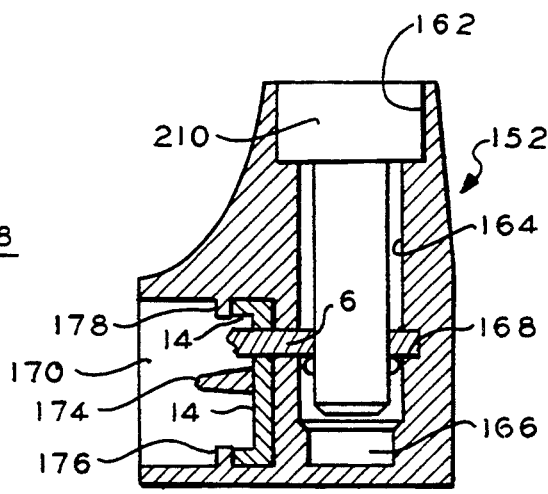
FIG. 27 is a sectional elevation view of the locking body of FIGS. 15–17 used with a locking barrel.

In FIG. 27, the locking body 152 of the embodiment of FIGS. 15–17 is shown with a prior art all metal locking barrel 210. In this embodiment, the all-metal body 152 and locking barrel 210 provide higher security. To provide a lower level of security, the locking barrel 210 may be used with the thermoplastic locking body 90 of FIGS. 6–10. In this case, the all-metal locking barrel 210 is buried in cavity 98 requiring destruction of body 90 in order to break open the seal. This arrangement is more costly than the prior described embodiments using a thermoplastic locking member instead of barrel 210. Of course, the barrel lock 210 is not keyless, whereas all of the other embodiments disclosed are keyless. The structures of the copending patent application and U.S. Pat. No. 4,144,729 mentioned in the introductory portion provide still higher levels of security and also higher costs.

Thus, progressively higher levels of security can be provided at corresponding progressive higher costs. However, such higher security and higher cost devices need only be provided where tampering has become evident and experience requires a more secure locking arrangement. Thus, a relatively low cost locking arrangement can be provided for a majority of electric utility meter installations and further higher level security arrangements provided only where needed.

It will be appreciated that various modifications can be made by one of ordinary skill in the art to the different embodiments disclosed. It is intended that the embodiments are examples only, and not limitations, and that the scope of the invention be defined by the appended claims.

What is claimed:

1. A locking device for sealing a hole of a given transverse dimension in a member, said hole defining an axis normal thereto and being defined by a member given thickness, said device comprising:
   a female member comprising:
   a flange; and
   at least one leg depending from the flange, said flange and leg being arranged so that the at least one leg is resiliently displaced transversely said axis in response to a corresponding displacement force, said at least one leg having a first portion adjacent to said flange transversely dimensioned to be received in said hole along said axis in a first insertion direction and a second portion depending from the first portion having a transverse outer dimension relative to said axis greater than said hole transverse dimension such that convergence of the at least one leg toward said axis is required to insert said second portion through said hole in said first direction; and
   a male locking member dimensioned to be inserted in said female member along said axis abutting said at least one leg for precluding said convergence in a locking state, said male locking member and female member being dimensioned to receive said male locking member in a second direction transverse the first direction and for restricting displacement of the male locking member from the female member in a direction opposite the first direction.

2. The device of claim 1 wherein the locking member has one of a mating groove and rib and said at least one leg has the other of said mating groove and rib for securing the locking member to the at least one leg for slidable displacement in said first direction.

3. The device of claim 2 including a pair of spaced legs depending from the flange, wherein the flange comprises first and second spaced halves and a connecting link resiliently connecting the halves, a different leg depending from a different half, each half and its depending leg including said one groove or rib, said locking member including a pair of said other groove and rib, each of said pair being on a different opposing said of the locking member.

4. The device of claim 3 including hinge means connecting said first and second halves for providing said resiliency.

5. The device of claim 4 including a first aperture in each said halves aligned transversely said first direction and a second aperture in said male member which aligns with the first aperture in said locking state.

6. The device of claim 4 wherein said locking member is dimensioned to substantially fill the space between said halves and legs.

7. The device of claim 6 wherein the locking member includes gripping means for withdrawing said locking member from between said legs in a direction opposite the first direction.

8. The device of claim 1 wherein said locking member has an idle state and a lock state, said locking member and female member including means for movably securing the locking member to the female member in said idle state while precluding withdrawing said locking member from the female member in a direction opposite said first direction.

9. A locking device for sealing a hole of a given transverse dimension in a member, said hole being defined by a member given thickness, said device comprising:
first and second spaced elements each comprising a flange portion and a leg portion depending therefrom in a given axial direction;
a resilient link for resiliently securing the elements relative to each other; and
a locking member dimensioned to be received between the elements for fixedly securing the elements in a minimum fixed spacing transverse said axial direction.

10. The device claim 9 wherein the flange portions and the leg portions distal the flange portion have a greater dimension transverse the axial direction than the leg portions proximal said flange portions.

11. The device of claim 10 wherein the locking member and elements are so dimensioned such that the locking member can only be inserted between the elements in a direction transverse the axial direction.

12. The device of claim 11 wherein the locking member inserted between the elements has a first axial idle position in which the legs can displace toward each other and a second axial locking position in which the legs are locked in a minimum fixed transverse spacing.

13. A keyless locking ring device comprising:
a resilient ring member adapted to clamp a plurality of annular elements thereto in a lock state and having a first end in a position normally spaced from a second end in an unlocked state, said ends being resiliently displaceable toward and away from one another in directions lying in a plane, one of said ends having a first hole therein lying in a first axis transverse said plane;
a body secured to the other of said ends having a second hole lying on a second axis parallel to the first axis and positioned so that the first and second axes are coaxial in a first position of the ends resiliently displaced toward each other wherein the holes are axially aligned; and
a male member adapted to be inserted in an axial direction in said first and second aligned holes and including means for axially locking the male member in said holes in said lock state in said axial direction in response to the force created by the resilient displacement of the ends to return to their normal spaced position.

14. The device of claim 13 wherein the first hole has a given transverse dimension, said ring member having a given thickness at said first hole, said male member having a flange member and a leg depending from the flange member, said leg having a first portion of a given axial extent and a transverse dimension proximal said flange member smaller than a second portion transverse dimension distal said flange member, said first portion axial extent being such that the first portion is fully within said first hole in said lock state and the second portion protrudes beyond said first hole distal said flange member wherein the ring is locked between said flange member and said second portion.

15. The device of claim 13 wherein the body has a first recess for receiving said flange member, said body and flange member each having at least one aperture which align in said lock state for receiving a seal device for sealing the male member in said lock state.

16. The device of claim 15 wherein the body has a second recess of a given geometrical shape at the egress of said first recess, said flange member having said given geometrical shape dimensioned to be received in said second recess at the body egress end of said second recess.

17. The device of claim 15 wherein the flange member has a pair of spaced grooves spaced from said aligned apertures in the axial insertion direction.

18. The device of claim 13 wherein the body and male member are molded thermoplastic.

19. The device of claim 13 wherein the body is metal and the male member is molded thermoplastic.

20. The device of claim 13 wherein the other of said ring member ends end portion extends radially outwardly from the ring member, said latter end portion including first locking means formed therein, said body having second locking means mating with the first locking means to lock the body to said latter end portion.

21. The device of claim 20 wherein the one end of the ring member has a second end portion extending radially outwardly from the ring member, said second end portion including a plate member extending therefrom tangentially from the ring member, said body and said other end portion each having an opening for receiving said second end portion, said second end portion having said first hole which passes through said second end portion in said lock state.

22. A locking device adapted to be locked in a hole having a given axial extent, said locking device comprising:
a head dimensioned greater than said hole in a direction transverse said axial extent to preclude entering the hole;
at least one leg depending from the head in an axial direction, said at least one leg having a distal portion and a proximal portion, the proximal portion being next adjacent to the head and smaller in dimension transverse the axial direction than said distal portion and at least as great in the axial direction as said axial extent, said at least one leg being resilient at its distal portion relative to said head, said distal portion having a peripheral surface normally extending in the transverse direction a distance greater than the transverse extent of said hole and resiliently displacing transversely in a given direction in response to insertion through said hole;
a male lock member adapted to be selectively secured to said head and depending leg for precluding said resilient transverse displacement of said leg in said given direction; and a resilient ring member lying in a first plane and adapted to clamp a plurality of annular elements thereto in a lock state, said ring member having a first end in a position normally spaced from a second end in an unlocked state, said ends being resiliently displaceable toward and away from one another in said plane, one of said ends having a hole therein lying in a second plane parallel to said first plane, said axial extent being transverse said first plane, the other of said ends having an opening for receiving said first end.

23. A method of securing a clamping ring to a plurality of annular elements, said clamping ring having first and second ends normally in spaced relation, the ring being adapted to resiliently displace the ends toward each other, the ends including means such that one end passes through the other end, the one end having a hole that passes through the other end when the ends are engaged, the method comprising:

providing a plurality of keyless locking devices for mating and attachment to at least the one end so as to provide progressively a higher security level and a more costly security for locking the ends together.

24. The method of claim 23 wherein the providing step includes:

providing a first keyless locking device of a lower locking and cost level formed only of thermoplastic material:

providing a second keyless locking device of a higher locking security level and cost level, including a female body secured to the ring first end and a male member for securing the ring second end to the first end, the body being formed of thermoplastic and metal material;

providing said first locking device of said thermoplastic material in which the locking device is locked solely with a seal;

then providing said first locking device in which the device is self-locking and lockable with a seal; and then providing the second locking device for locking the ring with an all metal female locking body.

25. The method of claim 23 wherein the providing step includes providing an all thermoplastic keyless locking device, providing a female body and a male member locking device, the body being secured to one ring end, said body comprising a mixture of plastic and metal and then a higher security level employing an all metal body.

26. A locking device for sealing a hole of a given transverse dimension in a member, said hole being defined by a member given thickness, said device comprising:

first and second spaced elements each comprising a flange portion and a leg portion depending from the flange portion in a given axial direction;

a connecting link for securing the elements to each other; and a locking member dimensioned to be received between the elements for fixedly securing the elements in a minimum fixed spacing transverse said axial direction, the flange portions and the leg portions distal the flange portion having a greater dimension transverse the axial direction than the leg portions proximal said flange portions, the locking member and elements being so dimensioned such that the locking member can only be inserted between the elements in a direction transverse the axial direction.

27. The device of claim 26 wherein the connecting link is resilient for resiliently securing the elements relative to each other.

* * * * *